United States Patent
Shastry et al.

(10) Patent No.: US 7,345,601 B2
(45) Date of Patent: Mar. 18, 2008

(54) VARIABLE LENGTH CODING ALGORITHM FOR MULTIPLE CODING MODES

(75) Inventors: Pavan V. Shastry, Bangalore (IN); Sadanand Vasant Sheorey, Bangalore (IN); Suresh Babu Kolla, Sunnyvale, CA (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/611,948

(22) Filed: Dec. 18, 2006

(65) Prior Publication Data

US 2007/0139236 A1 Jun. 21, 2007

Related U.S. Application Data

(60) Provisional application No. 60/752,470, filed on Dec. 21, 2005.

(51) Int. Cl.
*H03M 7/40* (2006.01)
(52) U.S. Cl. .......................... 341/67; 341/65; 341/106
(58) Field of Classification Search .................. 341/67, 341/59, 65, 106
See application file for complete search history.

(56) References Cited

U.S. PATENT DOCUMENTS

| | | | | |
|---|---|---|---|---|
| 5,381,144 A * | 1/1995 | Wilson et al. | ................. | 341/63 |
| 6,573,846 B1 * | 6/2003 | Trivedi et al. | ................. | 341/67 |
| 6,781,529 B1 * | 8/2004 | Lin et al. | ..................... | 341/106 |
| 6,968,091 B2 * | 11/2005 | Faibish et al. | .............. | 382/251 |
| 7,055,018 B1 * | 5/2006 | Bratt et al. | ..................... | 712/4 |
| 7,113,115 B2 * | 9/2006 | Partiwala et al. | ............. | 341/67 |
| 7,174,561 B2 * | 2/2007 | Bixby et al. | ................... | 725/93 |
| 2006/0001555 A1 * | 1/2006 | Partiwala et al. | ............. | 341/51 |
| 2007/0104381 A1 * | 5/2007 | Chen et al. | ................. | 382/245 |
| 2007/0279266 A1 * | 12/2007 | Chen et al. | .................... | 341/67 |

\* cited by examiner

*Primary Examiner*—Linh Nguyen
(74) *Attorney, Agent, or Firm*—Robert D. Marshall, Jr.; W. James Brady; Frederick J. Telecky, Jr.

(57) ABSTRACT

A novel algorithm is shown that allows efficient generation of Variable Length Codes using a Very Large Instruction Word processor with multiple execution units. The code generation is parallelized to take advantage of the multiple execution units, significantly reducing the cycle count and the execution time.

12 Claims, 2 Drawing Sheets

VARIABLE LENGTH CODING ALGORITHM FOR MULTIPLE CODING MODES

CLAIM TO PRIORITY OF PROVISIONAL APPLICATION

This application claims priority under 35 U.S.C. §119(e)(1) of provisional application No. 60/752,470, filed Dec. 21, 2005.

TECHNICAL FIELD OF THE INVENTION

The technical field of this invention is variable length coding technology.

BACKGROUND OF THE INVENTION

Variable Length Coding (VLC) is the final lossless stage of the MPEG (Motion Picture Experts Group) video compression algorithm. In video compression, VLC is employed to further compress the quantized image. As shown in FIG. 1, VLC consists of three steps: zig-zag scanning in block 101; Run Length Encoding (RLE) performed in block 102; and Huffman Coding shown in block 103. At the decoder, VLC is the first step in the decoding process.

FIG. 2 shows the zig-zag scanning step. The quantized coefficients are read out in a zig-zag order starting from the DC component to the highest frequency component. RLE is used to code the string of data from the zig-zag scanner. Run length encoding codes the coefficients in the quantized block into a run length or number of occurrences and a level or amplitude. For example, four coefficients of value "10" are transmitted as {10,10,10,10}. Using RLE the level is 10 and the run of value of 10 is four. Thus using RLE {4, 10} is transmitted, thereby reducing the amount of data. Typically, RLE encodes a run of symbols into two bytes: a count; and a symbol. An end-of-block or last code symbol denotes the last data point.

At the final stage of compression, the Run Level Encoded data is Huffman encoded (Variable Length Coding). Symbols that occur more frequently are encoded with shorter codes than symbols that occur less frequently. Thus generally less coded bits are required. In video encoding millions of such codes are generated per second, thus Huffman encoding can greatly reduce the amount of coded data bits.

Normal video codecs generally employ a two mode VLC. The first mode is the table mode and the second mode is the escape mode. In the table mode, a look up table maps the most commonly occurring run-level-last triplets to their variable length codewords. All other triplets are coded in the escape mode. In the escape mode, an escape code is followed by the actual run, length and last values. Advanced video codecs such as MPEG4 and WMV9 use multi mode VLC. Typically there are 4 modes: a default table mode; a level escape mode; a run escape mode; and a full escape mode.

The default table mode is used when (level$\leq$LMAX) and (run$\leq$RMAX) where: LMAX is the maximum level corresponding to the given run in the VLC table; and RMAX is the maximum run at the given level in the VLC table. The codeword is obtained by indexing into the codeword table, using the level and run values.

The level escape mode is used when (LMAX<level$\leq$2*LMAX) and (run$\leq$RMAX). The level escape mode calculates new_level equal to level—LMAX.

The run escape mode is used when (RMAX<run$\leq$(2*RMAX+1)) and (level$\leq$LMAX). The run escape mode calculates new_run as run—(RMAX+1). In the level escape mode and the run escape mode, the corresponding modified values of level or run are used to obtain the codeword from the table. If the run-level pair does not satisfy either of the above conditions, then the full escape mode is used.

In the full escape mode the codeword is a predefined number of bits used to send the run, level and last values without any encoding.

When coding in any of the three escape modes, the generated codeword is prefixed by an escape code.

Current methods first need to determine the appropriate mode to be used to generate the codeword to be inserted into the bit-stream. The operation is sequential yielding very few opportunities for any parallel operation.

Other methods known in the prior art have attempted to reduce the sequential nature of the operations by extending the tables to encompass one of the escape modes. The codewords for the run-level pairs which need to be encoded in the selected escape mode are inserted into the table. Hence there is no need for explicit coding of that escape mode, because the codewords will be directly picked from the table.

This type of algorithm is highly conditional and has a multiple level nested if-else structure. Such algorithms are inefficient for Very Large Instruction Word (VLIW) architectures and cannot be software pipelined. VLIW architectures perform best on highly parallel code without conditionals. In VLC the bit stream cannot be written asynchronously, requiring a large loop carry dependency bound. This wastes the power of VLIW architectures such as the Texas Instruments C6400 digital signal processor family which can perform up to 8 operations per cycle.

Conditional execution statements present an additional difficulty. In VLIW architectures, conditional jumps are avoided in favor of conditioned instructions. These conditional instructions are executed or not executed based on the contents of a special conditional register. These registers are generally limited in number. The Texas Instruments 6400 family of digital signal processors has six such predicate registers. In VLC a large number of conditions have to be evaluated and all further processing depends on the result of these conditions, thus the process blocks the conditional registers for an excessive number of cycles. This causes a "register live too long" problem which further degrades the ability to schedule and optimize the code.

The third problem is memory load delay. In a typical VLC implementation, the run-level combination is loaded and then used to load the "last level at run" and the "last run at level" for the same. The domain of the given run level pair is then determined based on these values. The variable length codeword is then loaded from another table. Typically each load has a delay of 4 cycles. Since these loads are sequential, the length of the operation is greatly increased. This requires a larger number of iterations executing in parallel, which may not be possible to implement because of limited number of CPU registers.

SUMMARY OF THE INVENTION

This invention is a method for the efficient generation of variable length Huffman codes. While prior VLC implementations operated in a serial mode, the invention employs a method that may be efficiently implemented in highly parallel VLIW processor architectures.

BRIEF DESCRIPTION OF THE DRAWINGS

These and other aspects of this invention are illustrated in the drawings, in which.

DETAILED DESCRIPTION OF PREFERRED EMBODIMENTS

Figure 1:
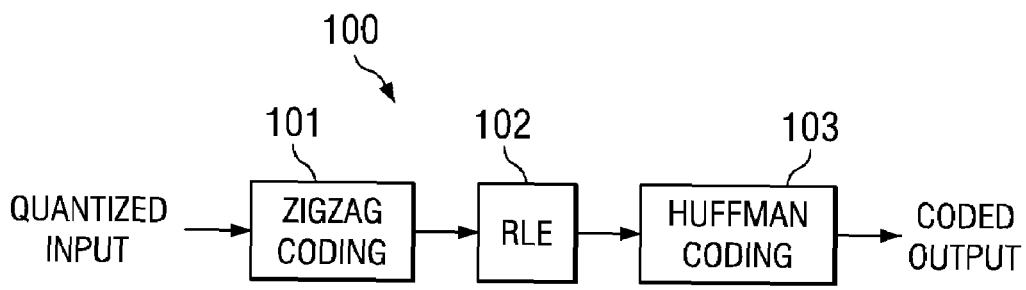
FIG. 1 shows a block diagram of a VLC encoder.
Figure 2:
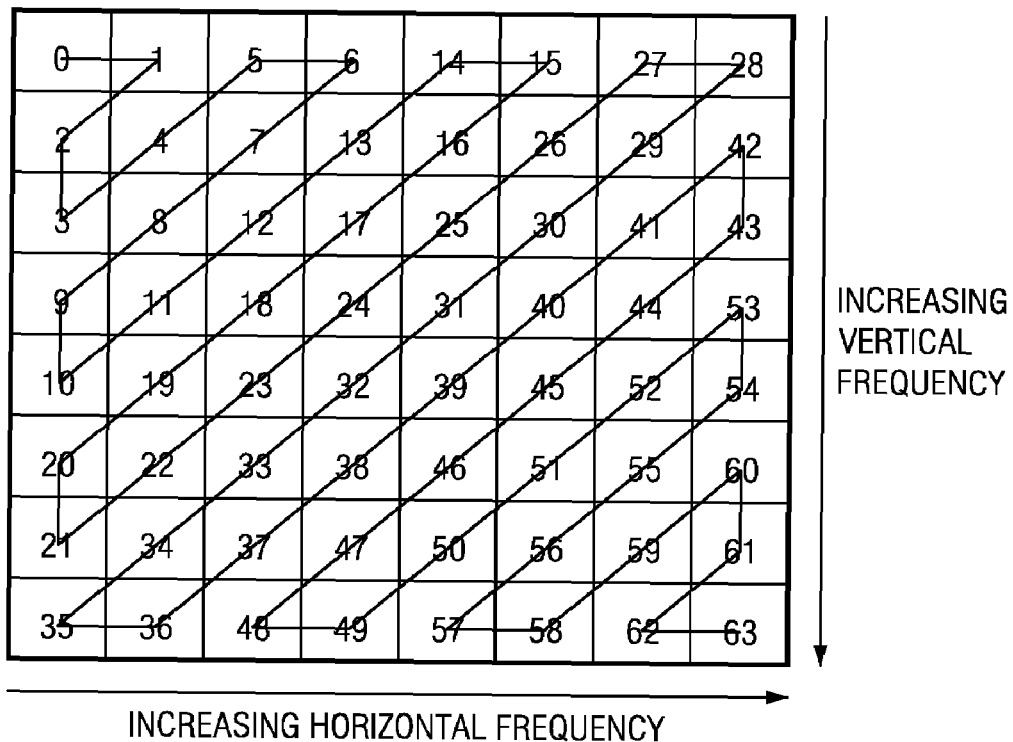
FIG. 2 shows the zig-zag scanning of coefficients.

This invention parallelizes the entire encoding process and minimizes the number of conditions to be evaluated.

The VLC tables are extended to encompass both the level escape mode and the run escape mode. This reduces the number of coding modes to 2: one for the table mode; and one for the full escape mode. This minimizes the need for excessive condition checks. The only remaining check is determining whether the full escape mode is applicable. This eliminated the difficulties introduced by the high number of parameters for decision making.

This invention uses a sixty four element map designated Lmax_at_run_tablemode[64]. This map defines the maximum level for each run which can be coded using the look up table. Thus for a given run-level pair, if the level is greater than Lmax_at_run_tablemode[R], then this run-level pair has to be coded using the full escape mode. Since this map is constructed for all possible run values from 0 to 63, the parameter Maximum run is no longer required. Because the map Lmax_at_run_tablemode[64] encompasses both the level escape mode and the run escape mode, the parameters LMAX which is the maximum run for a given level and RMAX which is the maximum level for a given run are no longer required. The number of required parameters is reduced to one. This minimizes the conditional switches between parameters if the execution loop handles coding of both the last and non-last coefficients.

Since the full escape mode encoding is independent of the other modes, it is performed in parallel. Thus two codewords are generated: one codeword assuming the full escape mode is required; and one codeword assuming a table mode. The correct codeword is selected, based on the condition for the full escape mode, and written out to the bit-stream.

This strategy addresses the following problems: the number of conditional checks is reduced; code execution is made more parallel; and increased parallelism reduces the length of single iterations.

The computations are parallelized into three independent paths. The first path determines whether table mode escape coding or non-escape coding is performed. The second path makes decisions assuming are the expanded table mode operates in the domain of the run level pair. The third path encodes the run level pair in the full escape mode. The correct codeword is selected based upon the domain decision. Once selected the codeword is written out to the bit-stream.

One implementation of this invention is described in the following. First, the tables are expanded to include both the level escape mode and the run escape mode. The table covering the level escape mode is expanded as follows: for each run, codewords are generated from levels (LMAX+1) to (2*LMAX); and appropriately inserted in the table. For levels greater than (2*LMAX), the run escape mode is used. Codewords for these levels are next inserted into the table, thereby taking care of the run escape mode. The map Lmax_at_run_tablemode[64] is then constructed. This gives the maximum level for each run which can be coded using the table. This table fits into the normal level escape mode and the run escape mode.

Figure 3:
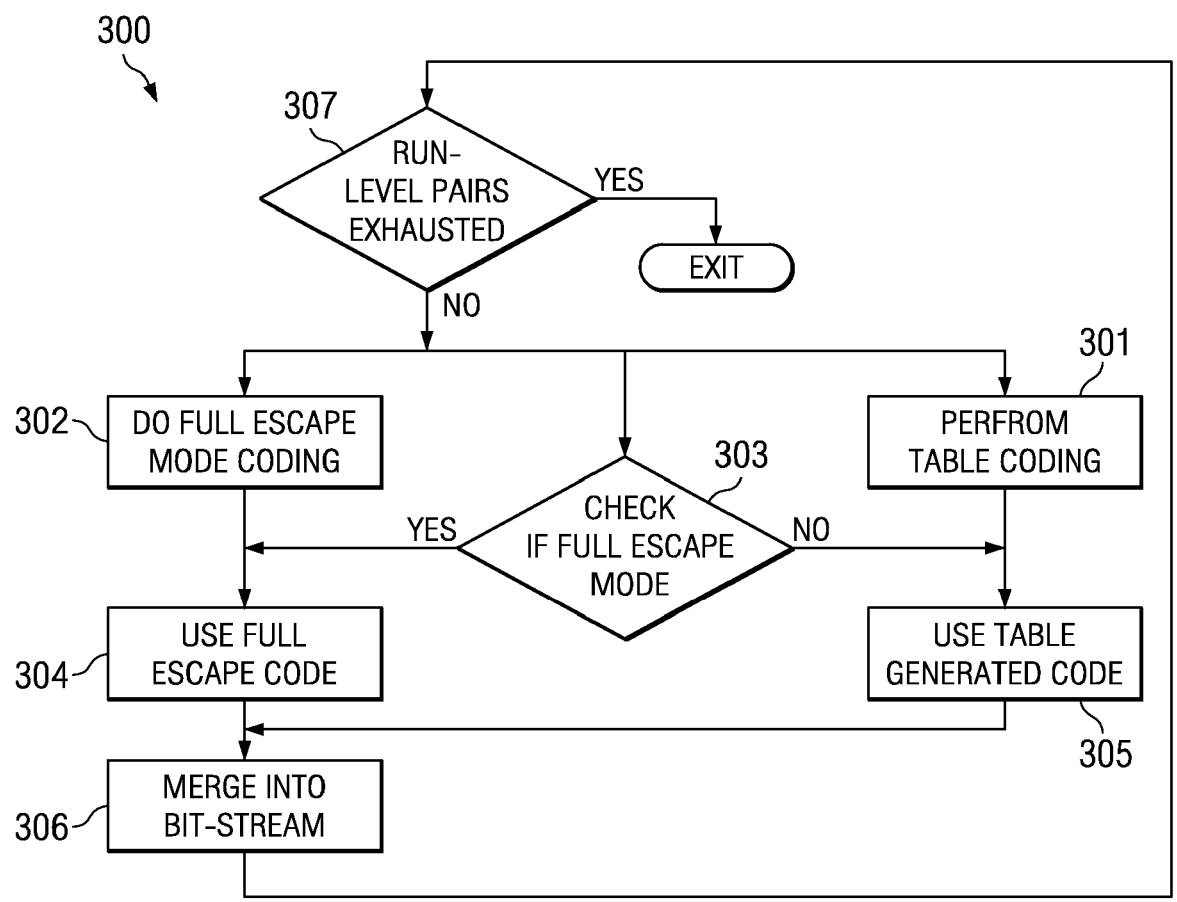
FIG. 3 is a flow chart of the algorithm of the invention.

FIG. 3 illustrates an example of actual processing steps of this implementation. For all run level (RL) pairs: The processing is partitioned into the three independent stages, to be executed in parallel. The first stage encodes the run level pair in block 301 using the table mode. The second stage performs full escape coding in block 302. In the third stage block 303 determines whether a given RL pair requires the full escape mode. This determination compares L with Lmax_at_run_tablemode[R].

Block 304 selects or rejects the full escape mode codeword depending on the decision in block 303. Block 304 selects or rejects the table mode codeword depending on the decision in block 303. Block 306 inserts the appropriate selected codeword into the bit-stream.

Block 307 causes this process to repeat unit all run level pairs are exhausted. After all non-last coefficients are processed, the tables are changed for last coefficient encoding and the above steps are repeated.

Table 1 shows the reduction in processor cycle count using this invention for encoding two MPEG test sequences.

TABLE 1

| Test case | Car phone - QCIF (K cycles/frame) | Foreman - QCIF (K cycles/frame) |
|---|---|---|
| K Cycles for old approach | 2087 | 1981 |
| K Cycles for new approach. | 1211 | 1197 |
| Percentage Improvement | 41.97% | 39.57% |

What is claimed is:

1. A method of generating variable length codes for run level pairs comprising the steps of:

generating a first variable length code by recalling a code from a look up table at a location corresponding to the run and the level of the run level pair;

generating a second variable length code using a full escape mode including an escape symbol, the run and the level of the run level pair;

determining which of the said first and second variable length codes is valid; and inserting the valid variable length code into the bit stream.

2. The method of claim 1, wherein:

the steps of (1) generating a variable length code by recalling a code from a look up table, (2) generating a second variable length code by using full escape mode and (3) determining which of the said two variable length codes is valid are performed in parallel.

3. The method of claim 1, further comprising the step of:

expanding the look up table to include variable length codes for the level escape mode by generating codewords from (LMAX+1) to (2*LMAX) for each run and inserting said codewords into the look up table.

4. The method of claim 1, further comprising the step of:

expanding the look up table to include variable length codes for the run escape mode by generating codewords for runs greater than (2*LMAX) and inserting said codewords into the look up table.

5. The method of claim 1, further comprising the step of:

constructing a maximum level map table containing the maximum level for each run which can be coded using the look up table.

6. The method of claim 5, wherein:
the step of determining which of the said two variable length codes is valid includes
recalling from the maximum level map table said maximum level corresponding to the run of the run level pair,
selecting the first variable length code if the run level of the run level pair is less than or equal to the recalled maximum level, and
selecting the second variable length code if the run level of the run level pair is greater than the recalled maximum level.

7. A data processing apparatus comprising:
a source of quantized digital data;
a look up table storing a code for each of a predetermined set of run level pairs;
a digital processing element operable to
generate a first variable length code by recalling a code from said look up table at a location corresponding to the run and the level of the run level pair,
generate a second variable length code using a full escape mode including an escape symbol, the run and the level of the run level pair,
determine which of the said first and second variable length codes is valid, and
insert the valid variable length code into the bit stream.

8. The data processing apparatus of claim 7, wherein:
said digital processing element is further operable to (1) generate a variable length code by recalling a code from said look up table, (2) generate a second variable length code by using full escape mode and (3) determine which of the two variable length codes is valid in a parallel manner.

9. The data processing apparatus of claim 7, further comprising:
said look up table consists of an expanded look up table including variable length codes for the level escape mode between (LMAX+1) and (2*LMAX) for each run.

10. The data processing apparatus of claim 7, further comprising:
said look up table consists of an expanded look up table including variable length codes for the run escape mode for runs greater than (2*LMAX).

11. The data processing apparatus of claim 7, further comprising:
a maximum level map table containing the maximum level for each run which can be coded using the look up table.

12. The data processing apparatus of claim 7, wherein:
said digital processing element is operable to determine which of the said two variable length codes is valid by
recalling from the maximum level map table said maximum level corresponding to the run of the run level pair,
selecting the first variable length code if the run level of the run level pair is less than or equal to the recalled maximum level, and
selecting the second variable length code if the run level of the run level pair is greater than the recalled maximum level.

* * * * *